June 24, 1941. J. F. FARRINGTON Re. 21,839

FREQUENCY CONVERTER

Original Filed March 16, 1938

INVENTOR
JOHN F. FARRINGTON
BY Laurence B. Dodds
ATTORNEY

Reissued June 24, 1941

Re. 21,839

UNITED STATES PATENT OFFICE 21,839

FREQUENCY CONVERTER

John F. Farrington, Tilton, N. H., assignor to Hazeltine Corporation, a corporation of Delaware Original No. 2,166,522, dated July 18, 1939, Serial No. 196,124, March 16, 1938. Application for reissue April 10, 1941, Serial No. 387,991

11 Claims. (Cl. 250—20)

Figure 1:
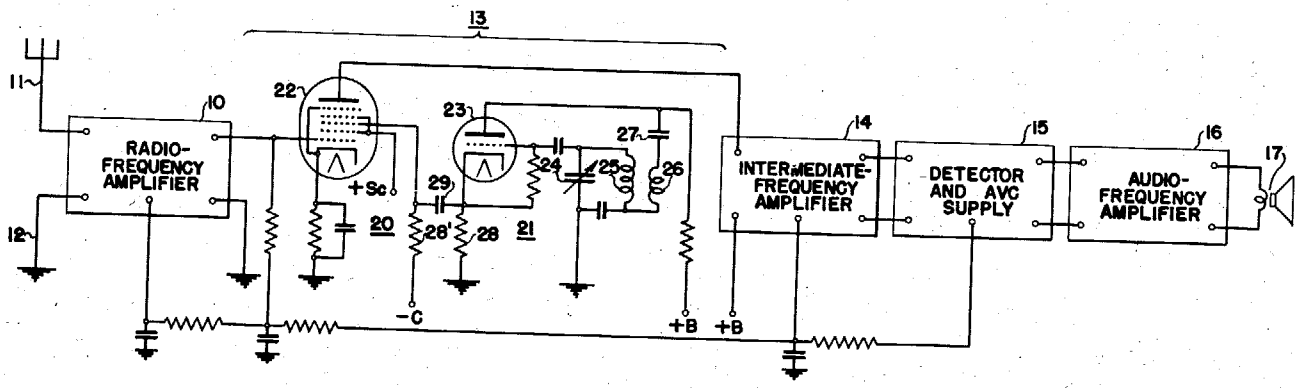

This invention relates generally to frequency converters, and particularly to frequency converters adapted to be utilized in modulated-carrier signal receivers of the superheterodyne type.

In frequency converters of superheterodyne receivers, there is provided a local oscillator with a frequency-determining circuit for generating oscillations which are modulated with a received signal to produce an intermediate-frequency signal. There is a tendency for the modulator to affect the frequency of the local oscillations. This variation of the oscillator frequency is due to the fact that the modulator is usually coupled relatively closely to the frequency-determining circuit of the oscillator so that changes in the impedance of the modulator grid circuit to which the oscillator is coupled affect the natural resonant frequency of the frequency-determining circuit. Such changes in impedance may be caused by variations in the supply potentials or A. V. C. potential applied to the modulator. Various attempts have been made to eliminate this difficulty. One such arrangement utilizes a common cathode resistor for coupling the oscillator section and the modulator section of a frequency converter. With this arrangement the effect of variations in impedance or trans-conductance of the modulator section of the frequency converter upon the frequency of the oscillator is materially reduced. However, when this circuit is utilized in a superheterodyne receiver, the efficiency of the converter is reduced by degeneration due to the cathode resistor which decreases the signal amplitude applied to the input electrodes of the modulator and which also applies to the input electrodes intermediate-frequency waves in such phase as to reduce the intermediate-frequency output.

It is an object of the present invention, therefore, to provide a frequency changer suitable for use in superheterodyne receivers in which the oscillation frequency is substantially independent of the impedance and transconductance characteristics of the modulator.

It is another object of the invention to provide a frequency converter suitable for use in superheterodyne receivers in which the modulator is not substantially coupled with the frequency-determining circuit of the oscillator.

In accordance with the invention, a frequency converter comprises, a modulator section and an oscillator section, each of the sections including a space current path comprising input and output electrodes. A signal-input circuit is coupled to the modulator input electrode and a frequency-determining circuit is coupled to the oscillator section, impedance means being included in the space current path of the oscillator section and substantially uncoupled with the above-mentioned frequency-determining circuit. The converter comprises means for coupling the oscillation voltage developed across the above-mentioned impedance means to an input electrode in the modulator section to modulate the signal input to the modulator section, whereby the resonant frequency of the frequency-determining circuit is not appreciably affected by variations in the impedance of the circuit of the modulator electrode to which said oscillation voltage is coupled.

Figure 2:
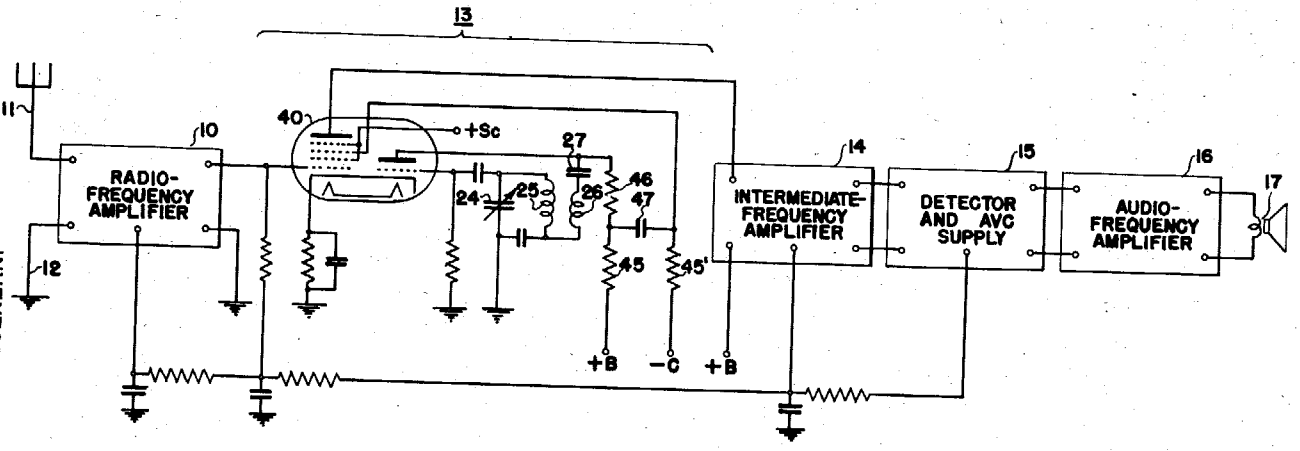

Referring now to the drawing, Figs. 1 and 2 are circuit diagrams, partly schematic, of complete superheterodyne receivers embodying different forms of the invention in the frequency converter or first detector of the receiver.

Referring now more particularly to Fig. 1, there is shown schematically a complete superheterodyne radio receiver embodying the present invention in a preferred form. In general, the receiver includes a radio-frequency amplifier 10 having its input circuit connected to an antenna 11 and ground 12 and its output circuit connected to a frequency changer or oscillator-modulator 13. Connected in cascade with the frequency changer 13, in the order named, are an intermediate-frequency amplifier 14 of one or more stages, a detector and automatic amplification control supply 15, an audio-frequency amplifier 16 of one or more stages, and a sound reproducer 17. An automatic amplification control bias, derived from A. V. C. supply 15, is applied to the grids of one or more of the tubes of amplifier 10, oscillator-modulator 13, and one or more of the grids of intermediate-frequency amplifier 14 in order to maintain the signal input to detector 15 within a relatively narrow range for a wide range of received signal amplitudes. It will be understood that the various circuits just described, with the exception of frequency-converter circuit 13, may be of a conventional construction and operation, the details of which are well known in the art, rendering detailed description thereof unnecessary.

Considering briefly the operation of the receiver as a whole and neglecting for the moment the operation of frequency converter 13, per se, presently to be described, a desired modulated signal is selected and amplified by radio-frequency amplifier 10, converted to a modulated intermediate-frequency signal in frequency changer 13, amplified by intermediate-frequency amplifier 14, and rectified by the detector 15, thereby deriving the audio-frequencies of modulation and the automatic amplification control bias potential. The audio-frequencies of modulation are, in turn, amplified in audio-frequency amplifier 16 and are reproduced by sound reproducer 17. The automatic amplification control circuit serves to maintain the volume output of the receiver within a relatively narrow range for a wide range of received signal amplitudes.

Referring now more particularly to the parts of the system involving the present invention, frequency converter 13 comprises a modulator section 20 and an oscillator section 21. The modulator section 20 comprises a mixer or modulator vacuum tube 22 having an input circuit coupled to radio-frequency amplifier 10 and an output circuit coupled to intermediate-frequency amplifier 14. The oscillator section 21 comprises a vacuum tube 23; a frequency-determining circuit connected to the grid circuit of tube 23 and including a variable tuning condenser 24 and an inductance 25; and an oscillation feed-back circuit comprising inductance 26 coupled to inductance 25 and connected to the anode of tube 23 through a blocking condenser 27. The tube 23 includes an un-bypassed resistor 28 in its cathode-ground circuit. Resistor 28 and condenser 29 serve to couple oscillator 21 to an input grid of tube 22, preferably the second input or injector grid. Suitable operating potentials are provided for tubes 22 and 23 from sources indicated on the drawing as −C, +Sc, and +B.

In considering the operation of the circuit just described, it will be seen that the oscillator section 21 is a conventional one, generating local oscillations at the resonant frequency of the frequency-determining circuit 24, 25. The variations in the plate current of tube 23 generate voltage waves of oscillator frequency across resistor 28. These waves are applied through condenser 29 to the injector grid of modulator tube 22 and they modulate the received signals at this frequency. It will be seen that resistor 28 is not substantially coupled with the oscillator frequency-determining circuit 24, 25. Furthermore, the value of resistor 28 can be made low as compared to the impedance of the injector grid circuit of tube 22, which is effectively in parallel with it. Consequently, variations in the impedance of the injector grid circuit, caused by changes in the operating potentials applied to the modulator tube 22, do not materially affect the frequency of the oscillator frequency-determining circuit 24, 25, or the amplitude of the oscillator voltage applied to the injector grid.

As illustrative of a specific application utilizing the circuit of Fig. 1, the following circuit constants are given:

| | |
|---|---|
| Tube 22 | Type 6L7 |
| Tube 23 | Type 6C5 |
| Resistor 28 ohms | 1,000 |
| Resistor 28′ ohms | 50,000 |

In Fig. 2 is shown a receiver embodying another form of the invention in which the space current paths of the oscillator and modulator sections are included in a common envelope, comprising a duplex vacuum tube 40. The circuit of the receiver of Fig. 2 is generally similar to that of Fig. 1 and like elements in the two figures have been given identical reference numerals. The duplex vacuum tube 40 contains modulator and oscillator sections which have a common cathode. The input circuit of the modulator section is coupled to the output circuit of radio-frequency amplifier 10 and the output circuit of the modulator section is coupled to the input circuit of intermediate-frequency amplifier 14. The oscillator circuit is similar to Fig. 1 except that resistor 28 is omitted from the cathode circuit and replaced by resistors 45 and 46 in the space current path of the oscillator section of tube 40. Resistor 45 and condenser 47 constitute the means for coupling the oscillator to an input grid of the modulator section of vacuum tube 40.

The operation of the circuit of Fig. 2 will be apparent from the description given above with respect to the operation of the circuit of Fig. 1. It is seen that oscillation voltages are developed across resistor 45 due to variations in the space current of the modulator section. Resistor 45 is not substantially coupled to the frequency-determining circuit due to the decoupling resistor 46. Therefore, variations in the impedance of the modulator section of vacuum tube 40 or the transconductance thereof do not materially affect the resonant frequency of frequency-determining circuit 24, 25.

It will be understood that either of the coupling circuits, comprising elements 28, 28′, and 29 of Fig. 1 or 45, 45′, and 47 of Fig. 2, may be designed to have a frequency-response characteristic which varies over the operating range of the oscillator in a complementary manner to the voltage developed across the output impedance in the space current path of the oscillator, thereby to maintain the voltage supplied to the modulator section from the oscillator section substantially constant.

While in each of the circuits illustrated and specifically described the locally-generated oscillations are applied to the third grid of the frequency converter tube, it will be understood by those skilled in the art that such oscillations may be applied to any suitable grid of such tube in accordance with well-known practice.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A frequency converter comprising a modulator section and an oscillator section, each of said sections including a space current path comprising input and output electrodes, a signal-input circuit coupled to the modulator input electrode, a frequency-determining circuit coupled to said oscillator section, impedance means included in the space current path of said oscillator section and substantially uncoupled with said frequency-determining circuit, a second input electrode in the space current path of said modulator section, and means for coupling an oscillation voltage developed across said impedance to said second input electrode to modulate the signal input to said modulator section, whereby the resonant frequency of said frequency-determining circuit is not appreciably affected by variations in the impedance of the circuit of said second electrode.

2. A frequency converter comprising a modulator section and an oscillator section, each of said sections including a space current path comprising input and output electrodes, a signal-input circuit coupled to the modulator input electrode, a frequency-determining circuit coupled to said oscillator section, a resistor included in the space current path of said oscillator section and substantially uncoupled with said frequency-determining circuit, a second input electrode in the space current path of said modulator section, and means for coupling an oscillation voltage developed across said resistor to said second input electrode to modulate the signal input to said modulator section, whereby the resonant frequency of said frequency-determining circuit is not appreciably affected by variations in the impedance of the circuit of said second electrode.

3. A frequency converter comprising a modulator section and an oscillator section, each of said sections including a space current path comprising input and output electrodes, a signal-input circuit coupled to the modulator input electrode, a frequency-determining circuit included in the input circuit of said oscillator section, impedance means included in the space current path of said oscillator section and substantially uncoupled with said frequency-determining circuit, a second input electrode in the space current path of said modulator section, and means for coupling an oscillation voltage developed across said impedance to said second input electrode to modulate the signal input to said modulator section, whereby the frequency of said frequency-determining circuit is not appreciably affected by variations in the impedance of the circuit of said second electrode.

4. A frequency converter comprising a modulator section and an oscillator section, each of said sections including a space current path comprising input and output electrodes and separate cathodes, a signal-input circuit coupled to the modulator input electrode, a frequency-determining circuit coupled to said oscillator section, an unbypassed resistor included in the cathode circuit of said oscillator section and substantially uncoupled with said frequency-determining circuit, a second input electrode in the space current path of said modulator section, and means for coupling an oscillation voltage developed across said resistor to said second input electrode to modulate the signal input to said modulator section, whereby the resonant frequency of said frequency-determining circuit is not appreciably affected by variations in the impedance of the circuit of said second electrode.

5. A frequency converter comprising a modulator section and an oscillator section, each of said sections including a space current path comprising input and output electrodes, said paths including a common cathode circuit, a signal-input circuit coupled to the modulator input electrode, a frequency-determining circuit coupled to said oscillator section, impedance means included in the space current path individual to said oscillator section and substantially uncoupled with said frequency-determining circuit, a second input electrode in the space current path of said modulator section, and means for coupling an oscillation voltage developed across said impedance to said second input electrode to modulate the signal input to said modulator section, whereby the resonant frequency of said frequency-determining circuit is not appreciably affected by variations in the impedance of the circuit of said second electrode.

6. A frequency converter comprising a modulator section and an oscillator section, each of said sections including a space current path comprising input and output electrodes, said paths including a common cathode circuit, a signal-input circuit coupled to the modulator input electrode, a frequency-determining circuit coupled to said oscillator section, a first resistor included in the space current path individual to said oscillator section, a second resistor for substantially decoupling said first resistor and said frequency-determining circuit, a second input electrode in the space current path of said modulator section, and means for coupling an oscillation voltage developed across said first resistor to said second input electrode to modulate the signal input to said modulator section, whereby the resonant frequency of said frequency-determining circuit is not appreciably affected by variations in the impedance of the circuit of said second electrode.

7. A frequency converter comprising a modulator section and an oscillator section, each of said sections including a space current path comprising input and output electrodes, a signal-input circuit coupled to the modulator-input electrode, a tunable frequency-determining circuit coupled to said oscillator section, a second input electrode in the space current path of said modulator section, impedance means included in the space current path of said oscillator section and coupled to said second input electrode for coupling a voltage to said second electrode to modulate the input signal to said modulator section, said impedance means being substantially uncoupled with said frequency-determining circuit, whereby the resonant frequency of said frequency-determining circuit is not substantially affected by variations in the impedance of the circuit of said second electrode, said impedance and its coupling to said second input electrode being so proportioned that the voltage coupled to said second input electrode from said impedance means is substantially constant over the tuning range of said frequency-determining circuit.

8. A frequency converter comprising a modulator section and an oscillator section, each of said sections including a space current path comprising input and output electrodes, a signal-input circuit coupled to the modulator input electrode, a frequency-determining circuit coupled to said oscillator section, impedance means included in the space current path of said oscillator section and substantially uncoupled with said frequency-determining circuit, and means for coupling an oscillation voltage developed across said impedance to an input electrode in said modulator section to modulate the signal input to said modulator section, whereby the resonant frequency of said frequency-determining circuit is not appreciably affected by variations in the impedance of the circuit of the modulator electrode to which said oscillation voltage is coupled.

9. A frequency converter comprising a modulator section and an oscillator section, each of said sections including a space current path comprising input and output electrodes and separate cathodes, a signal-input circuit coupled to the modulator input electrode, a frequency-determining circuit coupled to said oscillator section, an unby-passed resistor included in the cathode circuit of said oscillator section and substantially uncoupled with said frequency-determining circuit, and means for coupling an oscillation voltage developed across said resistor to an input electrode of said modulator section to modulate the signal input to said modulator section, whereby the resonant frequency of said frequency-determining circuit is not appreciably affected by variations in the impedance of the circuit of the modulator electrode to which said oscillation voltage is coupled.

10. A frequency converter comprising a modulator section and an oscillator section, each of said sections including a space current path comprising input and output electrodes, said paths including a common cathode circuit, a signal-input circuit coupled to the modulator input electrode, a frequency-determining circuit coupled to said oscillator section, impedance means included in the space current path individual to said oscillator section and substantially uncoupled with said frequency-determining circuit, and means for coupling an oscillation voltage developed across said impedance to an input electrode of said modulator section to modulate the signal input to said modulator section, whereby the resonant frequency of said frequency-determining circuit is not appreciably affected by variations in the impedance of the circuit of the modulator electrode to which said oscillation is coupled.

11. A frequency converter comprising a modulator section and an oscillator section, each of said sections including a space current path comprising input and output electrodes, a signal-input circuit coupled to the modulator-input electrode, a tunable frequency-determining circuit coupled to said oscillator section, impedance means included in the space current path of said oscillator section and coupled to an input electrode of said modulator section for coupling a voltage thereto to modulate the input signal to said modulator section, said impedance means being substantially uncoupled with said frequency-determining circuit, whereby the resonant frequency of said frequency-determining circuit is not substantially affected by variations in the impedance of the circuit of the modulator electrode to which said oscillation voltage is coupled, said impedance and its coupling to said modulator section being so proportioned that the voltage coupled to said modulator section from said impedance means is substantially constant over the tuning range of said frequency-determining circuit.

JOHN F. FARRINGTON.